United States Patent
He et al.

(10) Patent No.: US 11,328,641 B2
(45) Date of Patent: May 10, 2022

(54) SHIFT REGISTER UNIT, DRIVING METHOD THEREOF, GATE DRIVING CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Zhiyang He, Beijing (CN); Mindong Zheng, Beijing (CN); Youlu Li, Beijing (CN); Yongxian Xie, Beijing (CN); Qiang Liu, Beijing (CN); Hui Wang, Beijing (CN)

(73) Assignees: Hefei Xinsheng Optoelectronics Technology Co., Ltd., Anhui (CN); Boe Technology Group Co., Ltd., Beijing (CN)

( * ) Notice: Subject to any disclaimer, the term of this patent is extended or adjusted under 35 U.S.C. 154(b) by 99 days.

(21) Appl. No.: 16/839,413

(22) Filed: Apr. 3, 2020

(65) Prior Publication Data

US 2021/0158737 A1 May 27, 2021

(30) Foreign Application Priority Data

Nov. 27, 2019 (CN) .......................... 201911182695.9

(51) Int. Cl.
*G09G 3/20* (2006.01)
*G11C 19/28* (2006.01)

(52) U.S. Cl.
CPC ............ *G09G 3/20* (2013.01); *G11C 19/28* (2013.01); *G09G 2300/0809* (2013.01); *G09G 2310/0286* (2013.01)

(58) Field of Classification Search
CPC ............ G09G 3/20; G09G 2300/0809; G09G 2310/0286; G09G 2320/041; G09G 2310/0283; G09G 2300/0408; G11C 19/28

See application file for complete search history.

(56) References Cited

U.S. PATENT DOCUMENTS

| | | | | |
|---|---|---|---|---|
| 7,038,653 | B2* | 5/2006 | Moon | G11C 19/28 345/100 |
| 2014/0192039 | A1* | 7/2014 | Wang | G11C 19/28 345/213 |
| 2015/0179277 | A1* | 6/2015 | Pai | G09G 3/20 377/68 |
| 2016/0086562 | A1* | 3/2016 | Tan | G09G 3/3677 345/215 |
| 2017/0039971 | A1* | 2/2017 | Huang | G11C 19/184 |
| 2017/0061922 | A1* | 3/2017 | Wang | G11C 19/188 |
| 2017/0270851 | A1* | 9/2017 | Shang | G09G 3/2092 |
| 2018/0301075 | A1* | 10/2018 | Zhou | G09G 3/20 |
| 2018/0329547 | A1* | 11/2018 | Wu | G06F 3/0412 |

* cited by examiner

*Primary Examiner* — Benyam Ketema
(74) *Attorney, Agent, or Firm* — Muncy, Geissler, Olds & Lowe, P.C.

(57) ABSTRACT

A shift register unit, a driving method thereof, a gate driving circuit, and a display device are provided. The shift register unit includes an input branch and a reset branch; the input branch is configured to form or disconnect a first path between a first scan voltage terminal and a pull-up node under control of a potential of a first control terminal. The reset branch is configured to form or disconnect a second path between a second scan voltage terminal and the pull-up node under control of a potential of a second control terminal.

15 Claims, 5 Drawing Sheets

SHIFT REGISTER UNIT, DRIVING METHOD THEREOF, GATE DRIVING CIRCUIT AND DISPLAY DEVICE

CROSS-REFERENCE TO RELATED APPLICATION

This application claims a priority to Chinese Patent Application No. 201911182695.9 filed on Nov. 27, 2019, the disclosure of which is incorporated in its entirety by reference herein.

TECHNICAL FIELD

The present disclosure relates to the technical field of display driving, and in particular to a shift register unit, a driving method thereof, a gate driving circuit, and a display device.

BACKGROUND

Gate on array (GOA, a gate driving circuit being provided on an array substrate) technology is a technology in which a gate driving circuit is directly manufactured on an array substrate to replace an external chip. The advantage is that it can be directly manufactured on a panel and the cost and process are saved. Each GOA unit, as a shift register unit, sequentially passes a scan signal to a next GOA unit, and turns on TFT (thin film transistor) switches line by line to complete data signal input of pixel units.

With the rapid development of flat panel display technology, the demand for image quality of display panel is getting higher and higher. However, the display panel in the related technologies may fail to meet design requirements and may be defective.

SUMMARY

The present disclosure provides a shift register unit, including an input branch and a reset branch;

the input branch is configured to form or disconnect a first path between a first scan voltage terminal and a pull-up node under control of a potential of a first control terminal; and the reset branch is configured to form or disconnect a second path between a second scan voltage terminal and the pull-up node under control of a potential of a second control terminal.

In some embodiments, the input branch includes at least one auxiliary input transistor;

a control electrode of the auxiliary input transistor is electrically connected to the first control terminal, a first electrode of the auxiliary input transistor is electrically connected to the first scan voltage terminal, and a second electrode of the auxiliary input transistor is electrically connected to the pull-up node.

In some embodiments, the reset branch includes at least one auxiliary reset transistor;

a control electrode of the auxiliary reset transistor is electrically connected to the second control terminal, a first electrode of the auxiliary reset transistor is electrically connected to the pull-up node, and a second electrode of the auxiliary reset transistor is electrically connected to the second scan voltage terminal.

In some embodiments, the shift register unit according to the present disclosure further includes a switch circuit;

the switch circuit is configured to: under control of a switch control signal provided by a switch control line, control a connection between an input terminal and the first control terminal to be turned on and control a connection between a reset terminal and the second control terminal to be turned on.

In some embodiments, the switch circuit includes a first switch transistor and a second switch transistor;

a control electrode of the first switch transistor is electrically connected to the switch control line, a first electrode of the first switch transistor is electrically connected to the input terminal, and a second electrode of the first switch transistor is electrically connected to the first control terminal; and a control electrode of the second switch transistor is electrically connected to the switch control line, a first electrode of the second switch transistor is electrically connected to the reset terminal, and a second electrode of the second switch transistor is electrically connected to the second control terminal.

In some embodiments, the shift register unit according to the present disclosure further includes a pull-up node control circuit;

the pull-up node control circuit is configured to control the pull-up node to be electrically connected to the first scan voltage terminal under control of an input signal provided by an input terminal, and to control the pull-up node to be electrically connected to the second scan voltage terminal under control of a reset signal provided by a reset terminal.

In some embodiments, the pull-up node control circuit includes an input transistor and a reset transistor;

a control electrode of the input transistor is electrically connected to the input terminal, a first electrode of the input transistor is electrically connected to the first scan voltage terminal, and a second electrode of the input transistor is electrically connected to the pull-up node; and a control electrode of the reset transistor is electrically connected to the reset terminal, a first electrode of the reset transistor is electrically connected to the pull-up node, and a second electrode of the reset transistor is electrically connected to the second scan voltage terminal.

In some embodiments, the shift register unit according to the present disclosure further includes a pull-down node control circuit, a pull-up node reset circuit, a storage capacitor, and an output circuit;

the pull-down node control circuit is configured to control a potential of a pull-down node under control of the pull-up node;

the pull-up node reset circuit is configured to reset a potential of the pull-up node under control of the pull-down node;

a first terminal of the storage capacitor is electrically connected to the pull-up node, and a second terminal of the storage capacitor is electrically connected to a gate driving signal output terminal; and the output circuit is configured to control the gate driving signal output terminal to output a gate driving signal under control of the potential of the pull-up node and the potential of the pull-down node.

In some embodiments, the pull-down node control circuit includes:

a first pull-down control transistor, a gate electrode and a drain electrode of which are electrically connected to a first voltage terminal, and a source electrode of which is electrically connected to a first pull-down control node;

a second pull-down control transistor, a gate electrode of which is electrically connected to the pull-up node, a drain electrode of which is electrically connected to the first pull-down control node, and a source electrode of which is electrically connected to a low voltage terminal, where the low voltage terminal is configured to provide a low voltage;

a third pull-down control transistor, a gate electrode of which is electrically connected to the first pull-down control node, a drain electrode of which is electrically connected to the first voltage terminal, and a source electrode of which is electrically connected to the first pull-down node;

a fourth pull-down control transistor, a gate electrode of which is electrically connected to the pull-up node, a drain electrode of which is electrically connected to the first pull-down node, and a source electrode of which is connected to the low voltage;

a fifth pull-down control transistor, a gate electrode and a drain electrode of which are electrically connected to a second voltage terminal, and a source electrode of which is electrically connected to a second pull-down control node;

a sixth pull-down control transistor, a gate electrode of which is electrically connected to the pull-up node, a drain electrode of which is electrically connected to the second pull-down control node, and a source electrode of which is electrically connected to the low voltage terminal;

a seventh pull-down control transistor, a gate electrode of which is electrically connected to the second pull-down control node, a drain electrode of which is electrically connected to the second voltage terminal, and a source electrode of which is electrically connected to the second pull-down node; and an eighth pull-down control transistor, a gate electrode of which is electrically connected to the pull-up node, a drain electrode of which is electrically connected to the second pull-down node, and a source electrode of which is connected to the low voltage.

In some embodiments, the pull-up node reset circuit includes:

a first pull-up reset transistor, a gate electrode of which is electrically connected to the first pull-down node, a drain electrode of which is electrically connected to the pull-up node, and a source electrode of which is connected to the low voltage; and a second pull-up reset transistor, a gate electrode of which is electrically connected to the second pull-down node, a drain electrode of which is electrically connected to the pull-up node, and a source electrode of which is connected to the low voltage.

In some embodiments, the output circuit includes:

an output transistor, a gate electrode of which is electrically connected to the pull-up node, a drain electrode of which is electrically connected to a clock signal terminal, and a source electrode of which is electrically connected to the gate driving signal output terminal;

a first output reset transistor, a gate electrode of which is electrically connected to the second pull-down node, a drain electrode of which is electrically connected to the gate driving signal output terminal, and a source electrode of which is connected to the low voltage; and a second output reset transistor, a gate electrode of which is electrically connected to the first pull-down node, a drain electrode of which is electrically connected to the gate driving signal output terminal, and a source electrode of which is connected to the low voltage.

The present disclosure also provides a method for driving a shift register unit, which is applied to the above-mentioned shift register unit. The method for driving the shift register unit includes:

forming or disconnecting, by the input branch, the first path between the first scan voltage terminal and the pull-up node under control of the potential of the first control terminal;

and forming or disconnecting, by the reset branch, the second path between the second scan voltage terminal and the pull-up node under control of the potential of the second control terminal.

In some embodiments, the shift register unit further includes a switch circuit.

The method for driving the shift register unit further includes:

comparing a temperature of the shift register unit with a predetermined temperature;

when the temperature of the shift register unit is less than the predetermined temperature, controlling, by the switch circuit under control of a switch control signal, a connection between an input terminal and the first control terminal to be turned on, and a connection between a reset terminal and the second control terminal to be turned on; and when the temperature of the shift register unit is greater than or equal to the predetermined temperature, controlling, by the switch circuit under control of the switch control signal, the input terminal to be disconnected from the first control terminal, and the reset terminal to be disconnected from the second control terminal, so that the first control terminal and the second control terminal are in a floating state.

The present disclosure also provides a gate driving circuit, including a plurality of stages of the above-mentioned shift register units.

In some embodiments, the shift register unit further includes a switch circuit, the switch circuit is configured to control, under control of a switch control signal provided by a switch control line, a connection between an input terminal and the first control terminal to be turned on, and a connection between a reset terminal and the second control terminal to be turned on;

the gate driving circuit further includes a temperature controller;

the temperature controller is configured to detect a temperature of the gate driving circuit, is configured to control the switch control signal, when the temperature is less than a predetermined temperature, so as to control a connection between the input terminal and the first control terminal to be turned on and control a connection between the reset terminal and the second control terminal to be turned on, and is configured to control the switch control signal, when the temperature is greater than or equal to the predetermined temperature, so as to control the first control terminal and the second control the terminal to be in a floating state.

The present disclosure further provides a display device, including the above-mentioned gate driving circuit.

BRIEF DESCRIPTION OF THE DRAWINGS

In order to explain the technical solutions of the embodiments of the present disclosure more clearly, the drawings used in the descriptions of the embodiments of the present disclosure will be briefly introduced hereinafter. Apparently, the drawings in the following descriptions are only some embodiments of the present disclosure. For those of ordinary skill in the art, other drawings can be obtained based on these drawings without any creative efforts.

DETAILED DESCRIPTION

Figure 1:
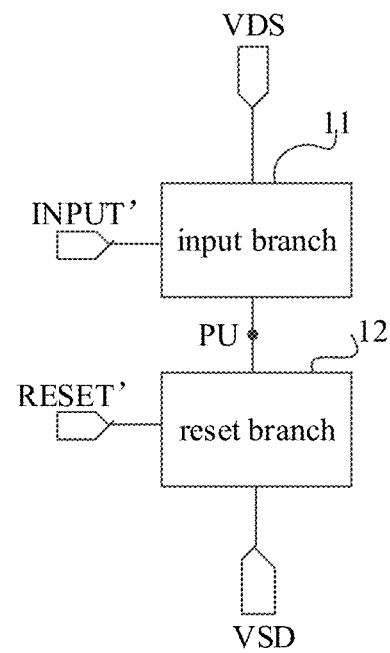
FIG. 1 is a structural diagram of a shift register unit according to some embodiments of the present disclosure.

The technical solutions in the embodiments of the present disclosure will be clearly and completely described hereinafter with reference to the drawings of the embodiments of the present disclosure. Apparently, the described embodiments are only a part rather than all of the embodiments of the present disclosure. Based on the embodiments in the present disclosure, all other embodiments obtained by a person of ordinary skill in the art without any creative efforts fall within the protection scope of the present disclosure.

In the related technologies, the temperature range for the quality evaluation of display panels is −10° C. to 60° C., while the temperature range for the quality evaluation of emerging automotive display panels is expanded to −40° C. to 85° C. TFT switches are made of semiconductors, and their characteristic curves are affected by temperature. The expansion of the operating temperature range further exacerbates the performance characteristics of TFT switches at different temperatures, which fails to meet the design requirements and results in defects. For example, at low temperatures, the turn-on current Ion decreases, the TFT switch cannot be turned on normally, and charging and noise reduction cannot be performed normally; at high temperatures, the leakage current Ioff increases, power consumption increases, and load increases, which fails to meet the design requirements and results in defects.

For the shift register unit in the related technologies, a turn-on current Ion of the input transistor is decreased at a low temperature, so that the input transistor cannot be normally turned on, and charging and noise reduction cannot be performed normally; and a leakage current is increased at a high temperature, so that power consumption may be increased due to electric leakage. In view of the above, embodiments of the present disclosure provide a shift register unit, a driving method thereof, a gate driving circuit, and a display device.

The transistors used in all the embodiments of the present disclosure may be triodes, thin film transistors or field effect transistors or other devices with the same characteristics. In the embodiments of the present disclosure, in order to distinguish the two electrodes of the transistor other than the control electrode, one of the electrodes is called a first electrode and the other electrode is called a second electrode.

In actual operation, when the transistor is a triode, the control electrode may be a base electrode, the first electrode may be a collector electrode, and the second electrode may be an emitter electrode; or the control electrode may be a base electrode, the first electrode may be an emitter electrode, and the second electrode may be a collector electrode.

In actual operation, when the transistor is a thin film transistor or a field effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

As shown in FIG. 1, some embodiments of the present disclosure provide a shift register unit. The shift register unit includes an input branch 11 and a reset branch 12.

The input branch 11 is electrically connected to a first control terminal INPUT', a first scan voltage terminal VDS, and a pull-up node PU, and is configured to form or disconnect a first path between the first scan voltage terminal VDS and the pull-up node PU under control of a potential of the first control terminal INPUT';

The reset branch 12 is electrically connected to a second control terminal RESET', a second scan voltage terminal VSD, and the pull-up node PU, and is configured to form or disconnect a second path between the second scan voltage terminal VSD and the pull-up node PU under control of a potential of the second control terminal RESET'.

In some embodiments of the present disclosure, when the shift register unit is in operation, in a case that a temperature of the shift register unit is less than a predetermined temperature, during a display period, in an input stage, the input branch 11 is controlled to form the first path between the first scan voltage terminal VDS and the pull-up node PU under the control of the potential of the first control terminal INPUT'; and in a reset stage, the reset branch 12 is controlled to form the second path between the second scan voltage terminal VSD and the pull-up node PU under the control of the potential of the second control terminal RESET', so as to compensate for the problem that the turn-on current Ion of the input transistor decreases at low temperatures, the input transistor cannot be turned on normally, and charging and noise reduction cannot be performed normally;

in a case that the temperature of the shift register unit is greater than or equal to the predetermined temperature, the input branch 11 is controlled to disconnect the first path between the first scan voltage terminal VDS and the pull-up node PU under the control of the potential of the first control terminal INPUT', and the reset branch 12 is controlled to disconnect the second path between the second scan voltage terminal VSD and the pull-up node PU under the control of the potential of the second control terminal RESET', so as to reduce the leakage current and reduce power consumption increase caused due to leakage at high temperatures.

In some embodiments, the input branch may include at least one auxiliary input transistor.

A control electrode of the auxiliary input transistor is electrically connected to the first control terminal, a first electrode of the auxiliary input transistor is electrically connected to the first scan voltage terminal, and a second electrode of the auxiliary input transistor is electrically connected to the pull-up node.

In some embodiments, the reset branch may include at least one auxiliary reset transistor.

A control electrode of the auxiliary reset transistor is electrically connected to the second control terminal, a first electrode of the auxiliary reset transistor is electrically connected to the pull-up node, and a second electrode of the auxiliary reset transistor is electrically connected to the second scan voltage terminal.

Figure 2:
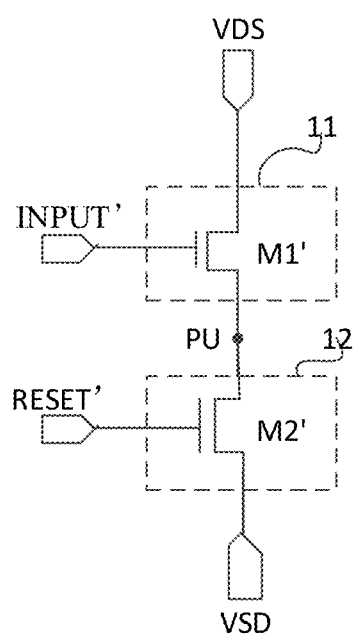
FIG. 2 is a structural diagram of a shift register unit according to some embodiments of the present disclosure.

As shown in FIG. 2, based on the embodiment of the shift register unit shown in FIG. 1, the input branch 11 may include an auxiliary input transistor M1', and the reset branch 12 may include an auxiliary reset transistor M2'.

A gate electrode of M1' is electrically connected to the first control terminal INPUT', a drain electrode of M1' is electrically connected to the first scan voltage terminal VDS, and a source electrode of M1' is electrically connected to the pull-up node PU.

A gate electrode of M2' is electrically connected to the second control terminal RESET', a drain electrode of M2' is electrically connected to the pull-up node PU, and a source electrode of M2' is electrically connected to the second scan voltage terminal VSD.

In the embodiment shown in FIG. 2, both M1' and M2' are n-type thin film transistors, but the present disclosure is not limited thereto.

When the embodiment of the shift register unit shown in FIG. 2 of the present disclosure is in operation, in a case that the temperature of the shift register unit is less than the predetermined temperature, during the display period, in the input stage, M1' is turned on under the control of the potential of the first control terminal INPUT' to form the first path between the first scan voltage terminal VDS and the pull-up node PU, and in the reset stage, M2' is turned on under the control of the potential of the second control terminal RESET' to form the second path between the pull-up node PU and the second scan voltage terminal VSD;

in a case that the temperature of the shift register unit is greater than or equal to the predetermined temperature, during the display period, M1' is turned off under the control of the potential of the first control terminal INPUT' to disconnect the first path between the first scan voltage terminal VDS and the pull-up node PU, and M2' is turned off under the control of the potential of the second control terminal RESET' to disconnect the second path between the pull-up node PU and the second scan voltage terminal VSD.

In specific implementations, the predetermined temperature may be selected according to actual conditions.

Specifically, in some embodiments of the present disclosure, the shift register unit may further include a switch circuit.

The switch circuit is configured to: under control of a switch control signal provided by a switch control line, control a connection between an input terminal and the first control terminal to be turned on and control a connection between a reset terminal and the second control terminal to be turned on.

In some embodiments of the present disclosure, the shift register unit may further include a switch circuit, and the switch circuit is controlled to switch on or off the connection between the input terminal and the first control terminal under the control of the switch control signal, and switch on the connection between the reset terminal and the second control terminal.

Figure 3:
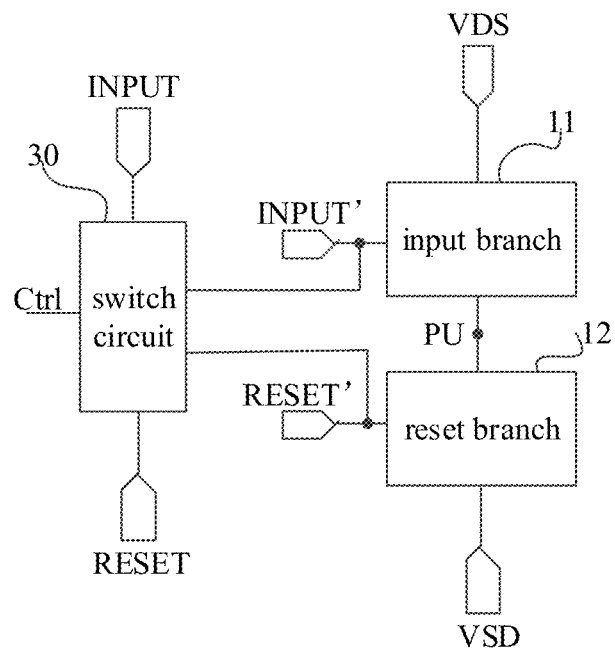
FIG. 3 is a structural diagram of a shift register unit according to some embodiments of the present disclosure.

As shown in FIG. 3, based on the embodiment of the shift register unit shown in FIG. 1, in some embodiments of the present disclosure, the shift register unit may further include a switch circuit 30.

The switch circuit 30 is electrically connected to the switch control line Ctrl, the input terminal INPUT, the first control terminal INPUT', the reset terminal RESET, and the second control terminal RESET', and is configured to turn on or turn off, under control of the switch control signal provided by the switch control line Ctrl, the connection between the input terminal INPUT and the first control terminal INPUT', and the connection between the reset terminal RESET and the second control terminal RESET'.

When the embodiment of the shift register unit shown in FIG. 3 of the present disclosure is in operation, in a case that the temperature of the shift register unit is lower than the predetermined temperature, the switch circuit 30 controls, under the control of the switch control signal provided by the switch control line Ctrl, the connection between INPUT and INPUT' to be turned on, and the connection between RESET and RESET' to be turned on;

in a case that the temperature of the shift register unit is greater than or equal to the predetermined temperature, the switch circuit 30 controls, under the control of the switch control signal provided by the switch control line Ctrl, the connection between INPUT and INPUT' to be turned off, and the connection between RESET and RESET' to be turned off.

Specifically, the switch circuit may include a first switch transistor and a second switch transistor.

A control electrode of the first switch transistor is electrically connected to the switch control line, a first electrode of the first switch transistor is electrically connected to the input terminal, and a second electrode of the first switch transistor is electrically connected to the first control terminal.

A control electrode of the second switch transistor is electrically connected to the switch control line, a first electrode of the second switch transistor is electrically connected to the reset terminal, and a second electrode of the second switch transistor is electrically connected to the two control terminal.

Figure 4:
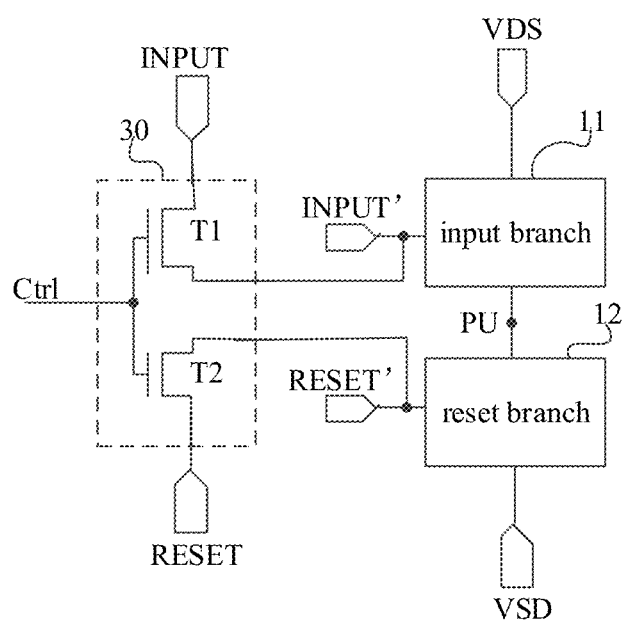
FIG. 4 is a structural diagram of a shift register unit according to some embodiments of the present disclosure.

As shown in FIG. 4, the switch circuit 30 includes a first switch transistor T1 and a second switch transistor T2.

A gate electrode of the first switch transistor T1 is electrically connected to a switch control line Ctrl, a drain electrode of the first switch transistor T1 is electrically connected to the input terminal INPUT, and a source electrode of the first switch transistor T1 is electrically connected to the first control terminal INPUT'.

A gate electrode of the second switch transistor T2 is electrically connected to the switch control line Ctrl, a drain electrode of the second switch transistor T2 is electrically connected to the reset terminal RESET, and a source electrode of the second switch transistor T2 is electrically connected to the second control terminal RESET'.

In the embodiment shown in FIGS. 4, T1 and T2 may be n-type thin film transistors, but the present disclosure is not limited thereto.

In the embodiment shown in FIG. 4, when T1 and T2 are n-type transistors, and in a case that the temperature of the shift register unit is lower than a predetermined temperature, the switch control signal input by Ctrl is a high level signal; in a case that the temperature of the shift register unit is greater than or equal to the predetermined temperature, the switch control signal input by Ctrl is a low level signal.

When T1 and T2 are p-type transistors, and in a case that the temperature of the shift register unit is less than the predetermined temperature, the switch control signal input by Ctrl is a low level signal; in a case that the temperature of the shift register unit is greater than or equal to the predetermined temperature, the switch control signal input by Ctrl is a high level signal.

In some embodiments of the present disclosure, the shift register unit may further include a pull-up node control circuit.

The pull-up node control circuit is configured to control the pull-up node to be electrically connected to the first scan voltage terminal under the control of an input signal provided by the input terminal, and to control the pull-up node to be electrically connected to the second scan voltage terminal under the control of a reset signal provided by the reset terminal.

In some embodiments of the present disclosure, the shift register unit may include a pull-up node control circuit, which controls the potential of the pull-up node under the control of an input signal and a reset signal.

Figure 5:
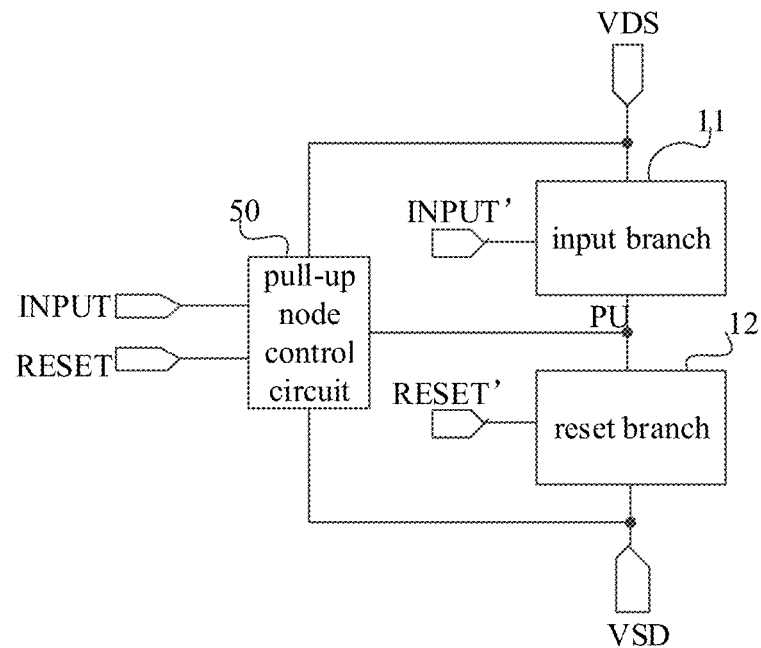
FIG. 5 is a structural diagram of a shift register unit according to some embodiments of the present disclosure.

As shown in FIG. 5, based on the embodiment of the shift register unit shown in FIG. 1, in some embodiments of the present disclosure, the shift register unit further includes a pull-up node control circuit 50.

The pull-up node control circuit 50 is electrically connected to the input terminal INPUT, the pull-up node PU, the first scan voltage terminal VDS, the reset terminal RESET, and the second scan voltage terminal VSD, and is configured to control the pull-up node PU to be electrically connected to the first scan voltage terminal VDS under control of the input signal provided by the input terminal INPUT, and control the pull-up node PU to be electrically connected to the second scan voltage terminal VSD under the control of the reset signal provided by the reset terminal RESET.

When the embodiment of the shift register unit shown in FIG. 5 of the present disclosure is in operation, in a case of forward scanning, the first scan voltage terminal VDS may input a high voltage signal, and the second scan voltage terminal VSD may input a low voltage signal; in a case of reverse scanning, the first scan voltage terminal VDS may input a low voltage signal, and the second scan voltage terminal VSD may input a high voltage signal; however, the present disclosure is not limited thereto. In the operating process of the embodiments of the present disclosure, forward scanning is taken as an example for illustration.

In the embodiment of the shift register unit shown in FIG. 5 in the present disclosure, the input terminal INPUT may be electrically connected to a gate driving signal output terminal of an adjacent shift register unit in the previous stage, and the reset terminal RESET may be electrically connected to a gate driving signal output terminal of an adjacent shift register unit in the next stage, but the present disclosure is not limited thereto.

When the embodiment of the shift register unit of the present disclosure as shown in FIG. 5 is in operation, and in a case of forward scanning, in the input stage, the pull-up node control circuit 50 controls the pull-up node PU to be electrically connected to the first scan voltage terminal VDS under the control of the input signal provided by the input terminal INPUT to control the potential of the PU to be a high level;

in the reset stage, the pull-up node control circuit 50 controls the pull-up node PU to be electrically connected to the second scan voltage terminal VSD under the control of the reset signal provided by the reset terminal RESET to control the potential of the PU to be reset to a low level.

Specifically, the pull-up node control circuit may include an input transistor and a reset transistor.

A control electrode of the input transistor is electrically connected to the input terminal, a first electrode of the input transistor is electrically connected to the first scan voltage terminal, and a second electrode of the input transistor is electrically connected to the pull-up node.

A control electrode of the reset transistor is electrically connected to the reset terminal, a first electrode of the reset transistor is electrically connected to the pull-up node, and a second electrode of the reset transistor is electrically connected to the second scan voltage terminal.

Figure 6:
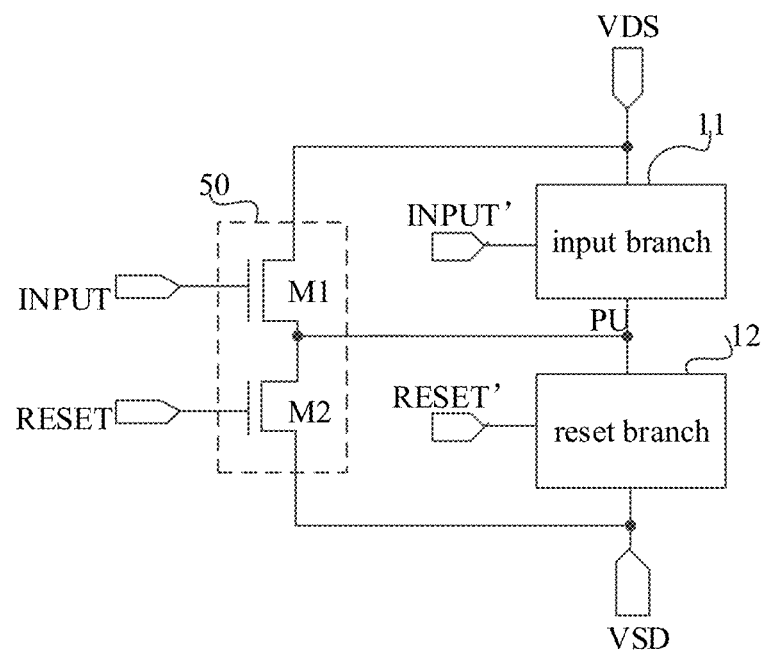
FIG. 6 is a structural diagram of a shift register unit according to some embodiments of the present disclosure.

As shown in FIG. 6, based on the embodiment of the shift register unit shown in FIG. 5, the pull-up node control circuit 50 includes an input transistor M1 and a reset transistor M2.

A gate electrode of the input transistor M1 is electrically connected to the input terminal INPUT, a drain electrode of the input transistor M1 is electrically connected to the first scan voltage terminal VDS, and a source electrode of the input transistor M1 is electrically connected to the pull-up Node PU.

A gate electrode of the reset transistor M2 is electrically connected to the reset terminal RESET, a drain electrode of the reset transistor M2 is electrically connected to the pull-up node PU, and a source electrode of the reset transistor M2 is electrically connected to the second scan voltage terminal VSD.

In the embodiment shown in FIGS. 6, M1 and M2 are both n-type thin film transistors, but the present disclosure is not limited thereto.

When embodiment of the shift register unit shown in FIG. 6 of the present disclosure is in operation, and in a case of forward scanning, in the input stage, INPUT inputs a high level, RESET inputs a low level, M1 is turned on and M2 is turned off;

in the reset stage, INPUT inputs a low level, RESET inputs a high level, M2 is turned on and M1 is turned off.

In some embodiments of the present disclosure, the shift register unit may further include a pull-down node control circuit, a pull-up node reset circuit, a storage capacitor, and an output circuit.

The pull-down node control circuit is configured to control the potential of the pull-down node under the control of the pull-up node.

The pull-up node reset circuit is configured to reset the potential of the pull-up node under the control of the pull-down node.

A first terminal of the storage capacitor is electrically connected to the pull-up node, and a second terminal of the storage capacitor is electrically connected to the gate driving signal output terminal.

The output circuit is configured to control the gate driving signal output terminal to output a gate driving signal under the control of the potential of the pull-up node and the potential of the pull-down node.

Figure 7:
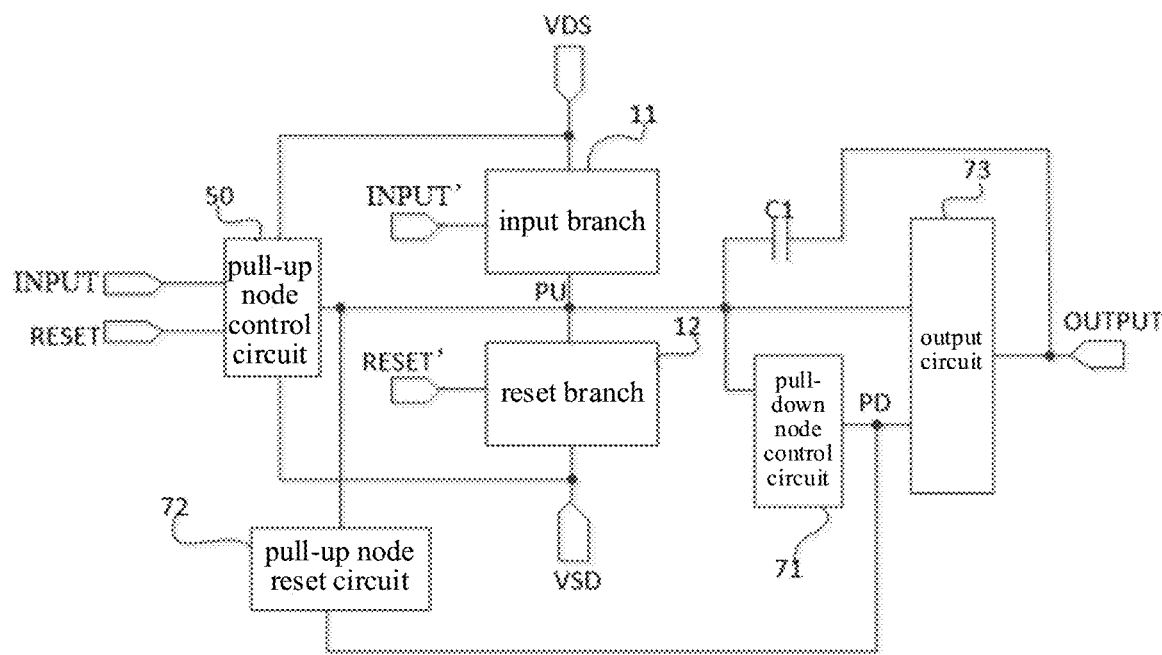
FIG. 7 is a structural diagram of a shift register unit according to some embodiments of the present disclosure.

As shown in FIG. 7, based on the embodiment of the shift register unit shown in FIG. 5, in some embodiments of the present disclosure, the shift register unit may further include a pull-down node control circuit 71 and a pull-up node reset circuit 72, a storage capacitor C1, and an output circuit 73.

The pull-down node control circuit 71 is electrically connected to the pull-up node PU and the pull-down node PD, and is configured to control the potential of the pull-down node PD under the control of the pull-up node PU.

The pull-up node reset circuit 72 is electrically connected to the pull-up node PU and the pull-down node PD, and is configured to control the potential of the pull-up node PU to be reset under the control of the pull-down node PD.

A first terminal of the storage capacitor C1 is electrically connected to the pull-up node PU, and a second terminal of the storage capacitor C1 is electrically connected to a gate driving signal output terminal OUTPUT.

The output circuit 73 is electrically connected to the pull-up node PU, the pull-down node PD, and the gate driving signal output terminal OUTPUT, and is configured to control the gate driving signal output terminal OUTPUT to output a gate driving signal under the control of the potential of the pull-up node PU and the potential of the pull-down node PD.

In specific implementation, the pull-down node may include a first pull-down node and a second pull-down node.

Figure 8:
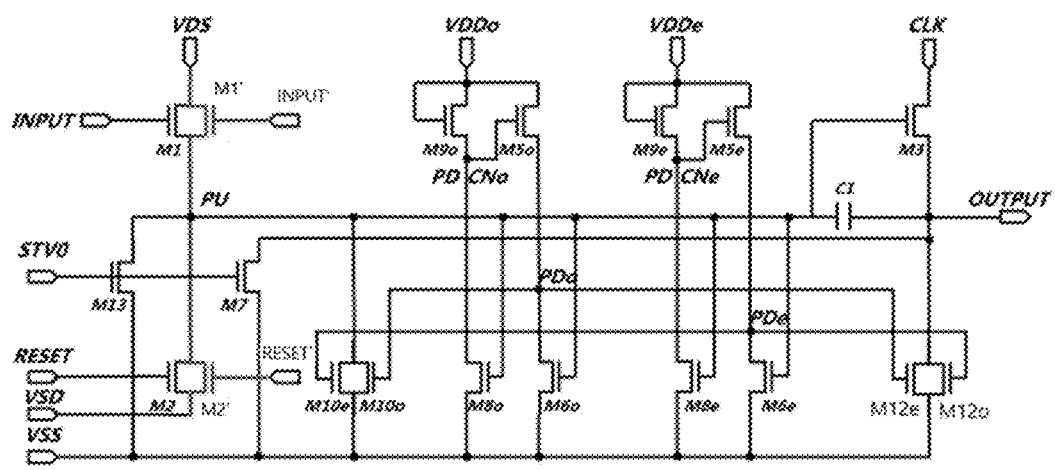
FIG. 8 is a circuit diagram of some specific embodiments of a shift register unit according to the present disclosure.

As shown in FIG. 8, on the basis of the embodiment of the shift register unit shown in FIG. 7:

The input branch may include an auxiliary input transistor M1', and the reset branch may include an auxiliary reset transistor M2'.

The gate electrode of M1' is electrically connected to the first control terminal INPUT', the drain electrode of M1' is electrically connected to the first scan voltage terminal VDS, and the source electrode of M1' is electrically connected to the pull-up node PU.

The gate electrode of M2' is electrically connected to the second control terminal RESET', the drain electrode of M2' is electrically connected to the pull-up node PU, and the source electrode of M2' is electrically connected to the second scan voltage terminal VSD.

The pull-up node control circuit includes an input transistor M1 and a reset transistor M2.

The gate electrode of the input transistor M1 is electrically connected to the input terminal INPUT, the drain electrode of the input transistor M1 is electrically connected to the first scan voltage terminal VDS, and the source electrode of the input transistor M1 is electrically connected to the pull-up node PU.

The gate electrode of the reset transistor M2 is electrically connected to the reset terminal RESET, the drain electrode of the reset transistor M2 is electrically connected to the pull-up node PU, and the source electrode of the reset transistor M2 is electrically connected to the second scan voltage terminal VSD.

The pull-down node control circuit includes a first pull-down control transistor M9o, a second pull-down control transistor M8o, a third pull-down control transistor M5o, a fourth pull-down control transistor M6o, a fifth pull-down control transistor M9e, a sixth pull-down control transistor M8e, a seventh pull-down control transistor M5e and an eighth pull-down control transistor M6e.

The gate electrode of M9O and the drain electrode of M9O are both electrically connected to the first voltage terminal VDDo, and the source electrode of M9O is electrically connected to the first pull-down control node PDCNo.

The gate electrode of M8o is electrically connected to the pull-up node PU, the drain electrode of M8o is electrically connected to the first pull-down control node PDCNo, and the source electrode of M8o is electrically connected to the low voltage terminal; the low voltage terminal is configured to provide a low voltage VSS.

The gate electrode of M5o is electrically connected to the first pull-down control node PDCNo, the drain electrode of M5o is electrically connected to the first voltage terminal VDDo, and the source electrode of M5o is electrically connected to the first pull-down node PDo.

The gate electrode of M6o is electrically connected to the pull-up node PU, the drain electrode of M6o is electrically connected to the first pull-down node PDo, and the source electrode of M6o is connected to the low voltage VSS.

The gate electrode of M9e and the drain electrode of M9e are both electrically connected to the second voltage terminal VDDe, and the source electrode of M9e is electrically connected to the second pull-down control node PDCNe.

The gate electrode of M8e is electrically connected to the pull-up node PU, the drain electrode of M8e is electrically connected to the second pull-down control node PDCNe, and the source electrode of M8e is electrically connected to the low voltage terminal; the low voltage terminal is configured to provide a low voltage VSS.

The gate electrode of M5e is electrically connected to the second pull-down control node PDCNe, the drain electrode of M5e is electrically connected to the second voltage terminal VDDe, and the source electrode of M5e is electrically connected to the second pull-down node PDe.

The gate electrode of M6e is electrically connected to the pull-up node PU, the drain electrode of M6e is electrically connected to the second pull-down node PDe, and the source electrode of M6e is connected to the low voltage VSS.

The pull-up node reset circuit includes a first pull-up reset transistor M10o and a second pull-up reset transistor M10e.

The gate electrode of M10o is electrically connected to PDo, the drain electrode of M10o is electrically connected to PU, and the source electrode of M10o is connected to low voltage VSS.

The gate electrode of M10e is electrically connected to PDe, the drain electrode of M10e is electrically connected to PU, and the source electrode of M10e is connected to low voltage VSS.

The output circuit may include an output transistor M3, a first output reset transistor M12o, and a second output reset transistor M12e.

The gate electrode of M3 is electrically connected to the PU, the drain electrode of M3 is electrically connected to the clock signal terminal CLK, and the source electrode of M3 is electrically connected to the gate driving signal output terminal OUTPUT.

The gate electrode of M12o is electrically connected to PDe, the drain electrode of M12o is electrically connected to OUTPUT, and the source electrode of M12o is connected to VSS.

The gate electrode of M12e is electrically connected to PDo, the drain electrode of M12e is electrically connected to OUTPUT, and the source electrode of M12e is connected to VSS.

In some embodiments of the present disclosure, the shift register unit further includes a first control transistor M7 and a second control transistor M13.

The gate electrode of M7 is electrically connected to the initial control terminal STV0, the drain electrode of M7 is electrically connected to OUTPUT, and the source electrode of M7 is connected to VSS.

The gate electrode of M13 is electrically connected to STV0, the drain electrode of M13 is electrically connected to the PU, and the source electrode of M13 is connected to VSS.

In the embodiment of the shift register unit shown in FIG. 8, all the transistors are n-type thin film transistors, but the present disclosure is not limited thereto.

In the embodiment of the shift register unit shown in FIG. 8, STV0 inputs a high level before the start of a frame display time and after the end of a frame display time, but the present disclosure is not limited thereto.

The shift register unit shown in FIG. 8 is only a shift register unit according to some embodiments of the present disclosure, and is not used to limit the structure of the shift register unit. The shift register unit according to the embodiments of the present disclosure may be a DC model or an AC model.

When the embodiment of the shift register unit shown in FIG. 8 is in operation, in a case that VDDo inputs a high voltage, VDDe inputs a low voltage; and in a case that VDDo inputs a low voltage, VDDe inputs a high voltage.

In the shift register unit according to the embodiments of the present disclosure, M1' and M2' are added to a shift register unit in the related technologies, and M1' and M2' may be controlled to be turned on or off according to the temperature, which achieves the purpose of reducing difference in characteristics of TFT (thin film transistor) switch in different temperature ranges and realizing normal use of the shift register unit in a wide temperature range.

The shift register unit according to the embodiments of the present disclosure can compensate for the problem of poor display caused by differences in TFT characteristics of the shift register unit in the related technologies in different temperature ranges (such as abnormal display (AD) caused by insufficient turn-on current Ion at low temperature; increased current and power consumption, and insufficient load caused by excessively high leakage current Ioff at high temperature).

Some embodiments of the present disclosure provide a method for driving a shift register unit. The method for driving the shift register unit may be applied to the above-mentioned shift register unit. The method for driving the shift register unit includes:

forming or disconnecting, by the input branch, the first path between the first scan voltage terminal and the pull-up node under control of the potential of the first control terminal;

and forming or disconnecting, by the reset branch, the second path between the second scan voltage terminal and the pull-up node under control of the potential of the second control terminal.

In some embodiments of the present disclosure, in the method for driving the shift register unit, in a case that a temperature of the shift register unit is less than a predetermined temperature, during a display period and in an input stage, the input branch is controlled to form the first path between the first scan voltage terminal and the pull-up node under the control of the potential of the first control terminal; and in a reset stage, the reset branch is controlled to form the second path between the second scan voltage terminal and the pull-up node under the control of the potential of the second control terminal, so as to compensate for the problem that the turn-on current Ion of the input transistor decreases at low temperatures, the input transistor cannot be turned on normally, and charging and noise reduction cannot be performed normally;

in a case that the temperature of the shift register unit is greater than or equal to the predetermined temperature, the input branch is controlled to disconnect the first path between the first scan voltage terminal and the pull-up node under the control of the potential of the first control terminal, and the reset branch is controlled to disconnect the second path between the second scan voltage terminal and the pull-up node under the control of the potential of the second control terminal, so as to reduce the leakage current and improve the situation in which power consumption is increased due to current leakage at high temperatures.

Specifically, the shift register unit may further include a switch circuit; the method for driving the shift register unit may further include:

comparing a temperature of the shift register unit with a predetermined temperature;

when the temperature of the shift register unit is less than the predetermined temperature, controlling, by the switch circuit under control of a switch control signal, a connection between an input terminal and the first control terminal to be turned on, and a connection between a reset terminal and the second control terminal to be turned on; and when the temperature of the shift register unit is greater than or equal to the predetermined temperature, controlling, by the switch circuit under control of the switch control signal, the input terminal to be disconnected from the first control terminal, and the reset terminal to be disconnected from the second control terminal, so that the first control terminal and the second control terminal are in a floating state.

In some embodiments of the present disclosure, in the method for driving the shift register unit, when the temperature of the shift register unit is lower than the predetermined temperature, the switch circuit controls, under the control of the switch control signal provided by the switch control line, the connection between the input terminal and the first control terminal to be turned on, and the connection between the reset terminal and the second control terminal to be turned on;

when the temperature of the shift register unit is greater than or equal to the predetermined temperature, the switch circuit controls, under the control of the switch control signal provided by the switch control line, the input terminal to be disconnected from the first control terminal, and the reset terminal to be disconnected from the second control terminal, so as to control the first control terminal and the second control terminal to be in the floating state.

Some embodiments of the present disclosure provide a gate driving circuit. The gate driving circuit includes a plurality of stages of the above-mentioned shift register units.

Specifically, the shift register unit further includes a switch circuit, and the switch circuit is configured to control, under control of a switch control signal provided by a switch control line, a connection between an input terminal and the first control terminal to be turned on, and a connection between a reset terminal and the second control terminal to be turned on.

The gate driving circuit further includes a temperature controller.

The temperature controller is configured to detect a temperature of the gate driving circuit, is configured to control the switch control signal, when the temperature is less than a predetermined temperature, so as to control a connection between the input terminal and the first control terminal to be turned on and control a connection between the reset terminal and the second control terminal to be turned on, and is configured to control the switch control signal, when the temperature is greater than or equal to the predetermined temperature, so as to control the first control terminal and the second control the terminal to be in a floating state.

In the gate driving circuit according to the embodiments of the present disclosure, an auxiliary input transistor, an auxiliary reset transistor and a switch circuit are added to a shift register unit included in a gate driving circuit in a GOA (Gate On Array, a gate driving circuit being provided on an array substrate) architecture in the related technologies. Further, a temperature controller is added, the temperature controller senses the temperature of the gate driving circuit to control the on or off state of the switch circuit, and then control the on or off state of the auxiliary input transistor and the auxiliary reset transistor. In this way, the purpose of reducing differences in characteristics of TFT switch in different temperature ranges is achieved, and normal use of GOA products in a wide temperature range is realized.

The temperature controller may be set according to of specific product requirements, which may use a first mode and a second mode.

When the temperature controller is in the first mode, the switch circuit controls, under the control of the switch control signal provided by the switch control line, a connection between the input terminal and the first control terminal to be turned on, and a connection between the reset terminal and the second control terminal to be turned on, then, in the input stage, the input terminal can control the input transistor to be turned on, the first control terminal can control the auxiliary input transistor to be turned on, and the first scan voltage provided by the first scan voltage terminal can enter the pull-up node through the input transistor and the auxiliary input transistor, to increase the turn-on current and compensate for the problem of insufficient turn-on current at low temperature; the reset terminal can control the reset transistor to be turned off, the second control terminal can control the auxiliary reset transistor to be turned off; in the reset stage, the reset terminal can control the reset transistor to be turned on, and the second control terminal can control the auxiliary reset transistor to be turned on, the input terminal can control the input transistor to be turned off, and the first control terminal can control the auxiliary input transistor to be turned off, then, in the reset stage, the reset terminal can control the reset transistor to be turned on, the second control terminal can control the auxiliary reset transistor to be turned on, and the second scan voltage provided by the second scan voltage terminal can enter the pull-up node may enter through the reset transistor and the auxiliary reset transistor, to increase the turn-on current and compensate for the problem of insufficient turn-on current at low temperature.

When the temperature controller is in the second mode, the switch circuit controls, under the control of the switch control signal provided by the switch control line, the input terminal to be disconnected from the first control terminal, and the reset circuit to be disconnected from the second control terminal, the signal cannot be provided to the first control terminal through the switch circuit, the reset signal cannot be provided to the second control terminal through the switch circuit, the first control terminal and the second control terminal are in a floating state, and the auxiliary input transistor and the auxiliary reset transistor are turned off, which improves the problem of electric leakage at high temperature and increased power consumption.

In a case, the first mode may be low temperature plus room temperature, and the second mode may be high temperature. In this case, the predetermined temperature may be greater than or equal to 40 degrees Celsius and less than or equal to 50 degrees Celsius, but the present disclosure is not limited thereto.

In another case, the first mode may be low temperature, and the second mode may be high temperature plus room temperature. In this case, the predetermined temperature may be greater than or equal to −5 degrees Celsius and less than or equal to 5 degrees Celsius, but the present disclosure is not limited thereto.

In some embodiments of the present disclosure, the shift register unit may include a shift register module and a switch circuit, and the shift register module may include an input branch, a reset branch, a pull-up node control circuit, and a pull-down node control circuit, a pull-up node reset circuit, a storage capacitor and an output circuit, but the present disclosure is not limited thereto.

Figure 9:
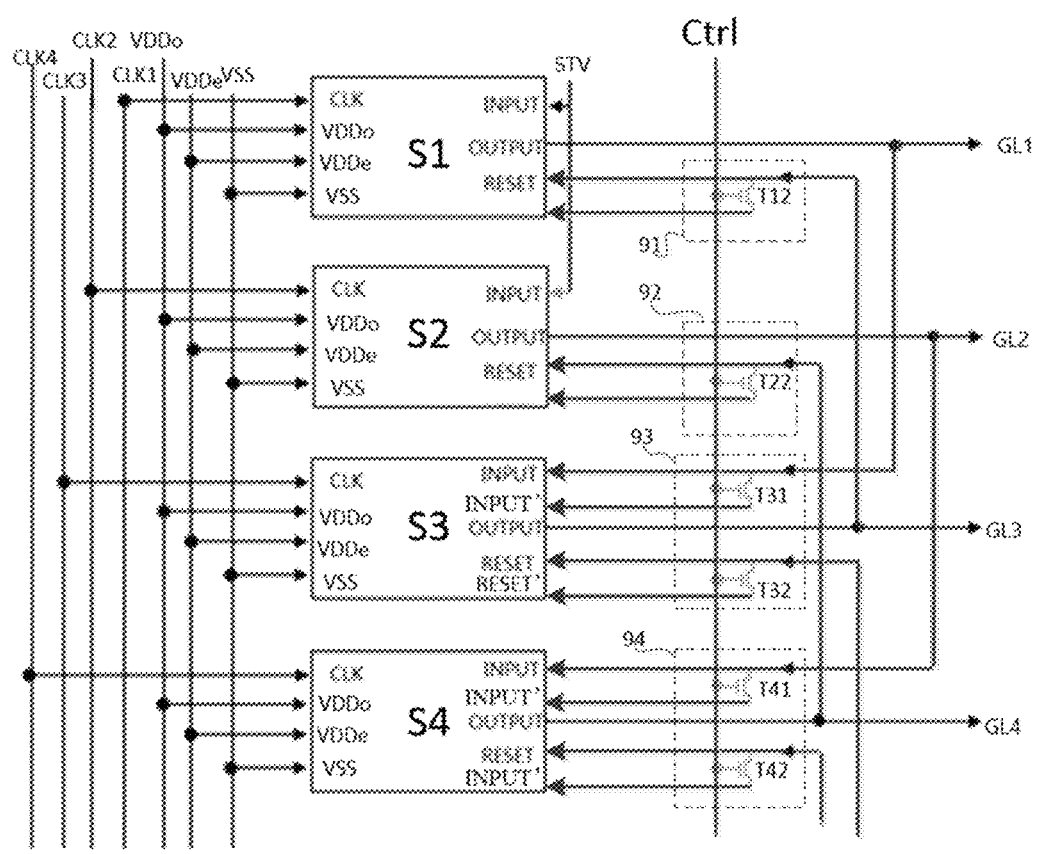
FIG. 9 is a structural diagram of the first four stages of shift register units included in a gate driving circuit according to some embodiments of the present disclosure.

As shown in FIG. 9, a gate driving circuit according to some embodiments of the present disclosure is shown, including a first stage of shift register unit, a second stage of shift register unit, a third stage of shift register unit, and a fourth stage of shift register unit.

The first stage of shift register unit includes a first stage of shift register module S1 and a first switch circuit 91.

The second stage of shift register unit includes a second stage of shift register module S2 and a second switch circuit 92.

The third stage of shift register unit includes a third stage of shift register module S3 and a third switch circuit 93.

The fourth stage of shift register unit includes a fourth stage of shift register module S4 and a fourth switch circuit 94.

In FIG. 9, reference sign CLK1 represents the first clock signal terminal, reference sign CLK2 represents the second clock signal terminal, reference sign CLK3 represents the third clock signal terminal, and reference sign CLK4 represents the fourth clock signal terminal. Reference sign VDDo represents the first voltage terminal, reference sign VDDe represents the second voltage terminal, reference sign VSS represents the low voltage, reference sign OUTPUT represents the gate driving signal output terminal, reference sign INPUT represents the input terminal, reference sign RESET represents the reset terminal, reference sign INPUT' represents the first control terminal, reference sign RESET' represents the second control terminal, and reference sign STV represents the initial signal.

The input terminal of S1 and the input terminal of S2 are connected to STV.

The first switch circuit 91 includes a first-stage second switch transistor T12.

The gate electrode of T12 is electrically connected to the switch control line Ctrl, the drain electrode of T12 is electrically connected to the reset terminal of S1, and the source electrode of T12 is electrically connected to the second control terminal of S1.

The second switch circuit 92 includes a second-stage second switch transistor T22.

The gate electrode of T22 is electrically connected to the switch control line Ctrl, the drain electrode of T12 is electrically connected to the reset terminal of S2, and the source electrode of T12 is electrically connected to the second control terminal of S2.

The third switch circuit 93 includes a third-stage first switch transistor T31 and a third-stage second switch transistor T32.

The gate electrode of T31 is electrically connected to the switch control line Ctrl, the drain electrode of T31 is electrically connected to the input terminal of S3, and the source electrode of T31 is electrically connected to the first control terminal of S3.

The gate electrode of T32 is electrically connected to the switch control line Ctrl, the drain electrode of T32 is electrically connected to the reset terminal of S3, and the source electrode of T32 is electrically connected to the second control terminal of S3.

The fourth switch circuit 94 includes a fourth-stage first switch transistor T41 and a fourth-stage second switch transistor T42.

The gate electrode of T41 is electrically connected to the switch control line Ctrl, the drain electrode of T41 is electrically connected to the input terminal of S4, and the source electrode of T41 is electrically connected to the first control terminal of S4.

The gate electrode of T42 is electrically connected to the switch control line Ctrl, the drain electrode of T42 is electrically connected to the reset terminal of S4, and the source electrode of T42 is electrically connected to the second control terminal of S4.

In the embodiment shown in FIG. 9, the transistors included in each switch circuit are all n-type thin film transistors, but the present disclosure is not limited thereto.

In the embodiment shown in FIG. 9, S1 is connected to CLK1, S2 is connected to CLK2, S3 is connected to CLK3, and S4 is connected to CLK4.

The input terminal of S3 is electrically connected to the gate driving signal output terminal of S1, and the first control terminal of S3 is electrically connected to the gate driving signal output terminal of S1.

The input terminal of S4 is electrically connected to the gate driving signal output terminal of S2, and the first control terminal of S4 is electrically connected to the gate driving signal output terminal of S2.

The first control terminal of S1 and the first control terminal of S2 are floating.

The reset terminal of S1 and the second control terminal of S1 are electrically connected to the gate driving signal output terminal of S3.

The reset terminal of S2 and the second control terminal of S2 are electrically connected to the gate driving signal output terminal of S4.

The gate driving signal output terminal of S1 is electrically connected to the first row of gate line GL1, the gate driving signal output terminal of S2 is electrically connected to the second row of gate line GL2, the gate driving signal output terminal of S3 is electrically connected to the third row of gate line GL3, and the gate driving signal output terminal of S4 is electrically connected to the fourth row of gate line GL4.

In some embodiments of the present disclosure, when the gate driving circuit according to the embodiments of the present disclosure is connected to four clock signals, the (4a−3)-th stage of shift register unit is connected to the first clock signal, and the (4a−2)-th stage of shift register unit is connected to the second clock signal, the (4a−1)-th stage of shift register unit is connected to the third clock signal, and the 4a-th stage of shift register unit is connected to the fourth clock signal, a is a positive integer.

The input terminal of the A-th stage of shift register unit is electrically connected to the gate driving signal output terminal of the (A−2)-th stage of shift register unit, the reset terminal of the A-th stage of shift register unit is electrically connected to the gate driving signal output terminal of the (A+2)-th stage of shift register unit, and A is a positive integer.

In some embodiments of the present disclosure, when the gate driving circuit according to the embodiments of the present disclosure is connected to two clock signals, the (2a−1)-th stage of shift register unit is connected to the first clock signal, the 2a-th stage of shift register unit is connected to the second clock signal, and a is a positive integer.

The input terminal of the A-th stage of shift register unit is electrically connected to the gate driving signal output terminal of the (A−1)-th stage of shift register unit, the reset terminal of the A-th stage of shift register unit is electrically connected to the gate driving signal output terminal of the (A+1)-th stage of shift register unit, and A is a positive integer.

In some embodiments of the present disclosure, when the gate driving circuit according to the embodiments of the present disclosure is connected to six clock signals, the (6a−5)-th stage of shift register unit is connected to the first clock signal, and the (6a−4)-th stage of shift The bit register unit is connected to the second clock signal, the (6a−3)-th stage of shift register unit is connected to the third clock signal, the (6a−2)-th stage of shift register unit is connected to the fourth clock signal, and the (6a−1)-th stage of shift register unit is connected to the fifth clock signal, and the 6a-th stage of shift register unit is connected to the sixth clock signal, where a is a positive integer.

The input terminal of the A-th stage of shift register unit is electrically connected to the gate driving signal output terminal of the (A−3)-th stage of shift register unit, and the reset terminal of the A-th stage of shift register unit is electrically connected to the gate driving signal output terminal of the (A+3)-th stage of shift register unit, and A is a positive integer.

In some embodiments of the present disclosure, when the gate driving circuit according to the embodiments of the present disclosure is connected to eight clock signals, the (8a−7)-th stage of shift register unit is connected to the first clock signal, the (8a−6)-th stage of shift register unit is connected to the second clock signal, the (8a−5)-th stage of shift register unit is connected to the third clock signal, the (8a−4)-th stage of shift register unit is connected to the fourth clock signal, the (8a−3)-th stage of shift register unit is connected to the fifth clock signal, the (8a−2)-th stage of shift register unit is connected to the sixth clock signal, the (8a−1)-th stage of shift register unit is connected to the seventh clock signal, and the 8a-th stage of shift register unit is connected to the eighth clock signal, where a is a positive integer.

The input terminal of the A-th stage of shift register unit is electrically connected to the gate driving signal output terminal of the (A−4)-th stage of shift register unit, and the reset terminal of the A-th stage of shift register unit is electrically connected to the gate driving signal output terminal of the (A+4)-th stage of shift register unit, where A is a positive integer.

Some embodiments of the present disclosure provide a display device. The display device includes the gate driving circuit described above.

The display device provided in the embodiments of the present disclosure may be any product or component having a display function, such as a mobile phone, a tablet computer, a television, a display, a notebook computer, a digital photo frame, or a navigator.

Compared with the related technologies, the shift register unit, the driving method thereof, the gate driving circuit and the display device of the present disclosure can compensate for the problem that the turn-on current Ion of the input transistor decreases at low temperatures, the input transistor cannot be turned on normally, and charging and noise reduction cannot be performed normally; and can reduce the leakage current at high temperatures and improve the situation in which power consumption is increased due to current leakage at high temperatures.

Unless otherwise defined, the technical or scientific terms used in the present disclosure shall have the common meanings understood by those of ordinary skill in the art to which the present disclosure belongs. The terms "first", "second", and the like used in the present disclosure do not indicate any order, quantity, or importance, but are only used to distinguish different components. Word such as "including" or "comprising" means that the element or item listed before the word covers the element or item listed after the word and the equivalent thereof without excluding other elements or items. Word such as "connected" or "coupled" are not limited to physical or mechanical connection, but may include electrical connection, whether direct or indirect. "Up", "down", "left", "right", etc., are only used to indicate the relative position relationship. When the absolute position of the described object changes, the relative position relationship may change accordingly.

The above descriptions illustrate some implementations of the present disclosure. It should be noted that, for those of ordinary skill in the art, without departing from the principles of the present disclosure, various improvements and polishments can be made. These improvements and polishments shall fall with the protection scope of the present disclosure.

What is claimed is:

1. A shift register unit, comprising
an input branch; and
a reset branch;
wherein the input branch is configured to form or disconnect a first path between a first scan voltage terminal and a pull-up node under control of a potential of a first control terminal,
wherein the reset branch is configured to form or disconnect a second path between a second scan voltage terminal and the pull-up node under control of a potential of a second control terminal, and
wherein the shift register unit further comprises at least one of:
a switch circuit, wherein the switch circuit is configured to: under control of a switch control signal provided by a switch control line, control a connection between an input terminal and the first control terminal to be turned on and control a connection between a reset terminal and the second control terminal to be turned on; or
a pull-up node control circuit, wherein the pull-up node control circuit is configured to control the pull-up node to be electrically connected to the first scan voltage terminal under control of an input signal provided by an input terminal, and to control the pull-up node to be electrically connected to the second scan voltage terminal under control of a reset signal provided by a reset terminal; or
a pull-down node control circuit, a pull-up node reset circuit, a storage capacitor, and an output circuit, wherein the pull-down node control circuit is configured to control a potential of a pull-down node under control of the pull-up node, the pull-up node reset circuit is configured to reset a potential of the pull-up node under control of the pull-down node, a first terminal of the storage capacitor is electrically connected to the pull-up node, a second terminal of the storage capacitor is electrically connected to a gate driving signal output terminal, and the output circuit is configured to control the gate driving signal output terminal to output a gate driving signal under control of the potential of the pull-up node and the potential of the pull-down node.

2. The shift register unit according to claim 1, wherein the input branch comprises at least one auxiliary input transistor; and
wherein a control electrode of the auxiliary input transistor is electrically connected to the first control terminal, a first electrode of the auxiliary input transistor is electrically connected to the first scan voltage terminal, and a second electrode of the auxiliary input transistor is electrically connected to the pull-up node.

3. The shift register unit according to claim 1, wherein the reset branch comprises at least one auxiliary reset transistor; and
wherein a control electrode of the auxiliary reset transistor is electrically connected to the second control terminal, a first electrode of the auxiliary reset transistor is electrically connected to the pull-up node, and a second electrode of the auxiliary reset transistor is electrically connected to the second scan voltage terminal.

4. The shift register unit according to claim 1 wherein the switch circuit comprises a first switch transistor and a second switch transistor;
wherein a control electrode of the first switch transistor is electrically connected to the switch control line, a first electrode of the first switch transistor is electrically connected to the input terminal, and a second electrode of the first switch transistor is electrically connected to the first control terminal; and
wherein a control electrode of the second switch transistor is electrically connected to the switch control line, a first electrode of the second switch transistor is electrically connected to the reset terminal, and a second electrode of the second switch transistor is electrically connected to the second control terminal.

5. The shift register unit according to claim 1, wherein the pull-up node control circuit comprises an input transistor and a reset transistor;
wherein a control electrode of the input transistor is electrically connected to the input terminal, a first electrode of the input transistor is electrically connected to the first scan voltage terminal, and a second electrode of the input transistor is electrically connected to the pull-up node; and
wherein a control electrode of the reset transistor is electrically connected to the reset terminal, a first electrode of the reset transistor is electrically connected to the pull-up node, and a second electrode of the reset transistor is electrically connected to the second scan voltage terminal.

6. The shift register unit according to claim 2, wherein the pull-up node control circuit comprises an input transistor and a reset transistor;
wherein a control electrode of the input transistor is electrically connected to the input terminal, a first electrode of the input transistor is electrically connected to the first scan voltage terminal, and a second electrode of the input transistor is electrically connected to the pull-up node; and
wherein a control electrode of the reset transistor is electrically connected to the reset terminal, a first electrode of the reset transistor is electrically connected to the pull-up node, and a second electrode of the reset transistor is electrically connected to the second scan voltage terminal.

7. The shift register unit according to claim 3, wherein the pull-up node control circuit comprises an input transistor and a reset transistor;
wherein a control electrode of the input transistor is electrically connected to the input terminal, a first electrode of the input transistor is electrically connected to the first scan voltage terminal, and a second electrode of the input transistor is electrically connected to the pull-up node; and
wherein a control electrode of the reset transistor is electrically connected to the reset terminal, a first electrode of the reset transistor is electrically connected to the pull-up node, and a second electrode of the reset transistor is electrically connected to the second scan voltage terminal.

8. The shift register unit according to claim 1, wherein the pull-down node control circuit comprises:
a first pull-down control transistor, a gate electrode and a drain electrode of which are electrically connected to a first voltage terminal, and a source electrode of which is electrically connected to a first pull-down control node;
a second pull-down control transistor, a gate electrode of which is electrically connected to the pull-up node, a drain electrode of which is electrically connected to the first pull-down control node, and a source electrode of which is electrically connected to a low voltage terminal, wherein the low voltage terminal is configured to provide a low voltage;
a third pull-down control transistor, a gate electrode of which is electrically connected to the first pull-down control node, a drain electrode of which is electrically connected to the first voltage terminal, and a source electrode of which is electrically connected to the first pull-down node;
a fourth pull-down control transistor, a gate electrode of which is electrically connected to the pull-up node, a drain electrode of which is electrically connected to the first pull-down node, and a source electrode of which is connected to the low voltage;
a fifth pull-down control transistor, a gate electrode and a drain electrode of which are electrically connected to a second voltage terminal, and a source electrode of which is electrically connected to a second pull-down control node;
a sixth pull-down control transistor, a gate electrode of which is electrically connected to the pull-up node, a drain electrode of which is electrically connected to the second pull-down control node, and a source electrode of which is electrically connected to the low voltage terminal;
a seventh pull-down control transistor, a gate electrode of which is electrically connected to the second pull-down control node, a drain electrode of which is electrically connected to the second voltage terminal, and a source electrode of which is electrically connected to the second pull-down node; and
an eighth pull-down control transistor, a gate electrode of which is electrically connected to the pull-up node, a drain electrode of which is electrically connected to the second pull-down node, and a source electrode of which is connected to the low voltage.

9. The shift register unit according to claim 8, wherein the pull-up node reset circuit comprises:
a first pull-up reset transistor, a gate electrode of which is electrically connected to the first pull-down node, a drain electrode of which is electrically connected to the pull-up node, and a source electrode of which is connected to the low voltage; and
a second pull-up reset transistor, a gate electrode of which is electrically connected to the second pull-down node, a drain electrode of which is electrically connected to the pull-up node, and a source electrode of which is connected to the low voltage.

10. The shift register unit according to claim 9, wherein the output circuit comprises:
an output transistor, a gate electrode of which is electrically connected to the pull-up node, a drain electrode of which is electrically connected to a clock signal terminal, and a source electrode of which is electrically connected to the gate driving signal output terminal;
a first output reset transistor, a gate electrode of which is electrically connected to the second pull-down node, a drain electrode of which is electrically connected to the gate driving signal output terminal, and a source electrode of which is connected to the low voltage; and
a second output reset transistor, a gate electrode of which is electrically connected to the first pull-down node, a drain electrode of which is electrically connected to the gate driving signal output terminal, and a source electrode of which is connected to the low voltage.

11. A method for driving a shift register unit, applied to the shift register unit according to claim 1, comprising:
forming or disconnecting, by the input branch, the first path between the first scan voltage terminal and the pull-up node under control of the potential of the first control terminal; and
forming or disconnecting, by the reset branch, the second path between the second scan voltage terminal and the pull-up node under control of the potential of the second control terminal.

12. The method for driving the shift register unit according to claim 11, wherein the method for driving the shift register unit further comprises:
comparing a temperature of the shift register unit with a predetermined temperature;
when the temperature of the shift register unit is less than the predetermined temperature, controlling, by the switch circuit under control of a switch control signal, a connection between the input terminal and the first control terminal to be turned on, and a connection between the reset terminal and the second control terminal to be turned on; and
when the temperature of the shift register unit is greater than or equal to the predetermined temperature, controlling, by the switch circuit under control of the switch control signal, the input terminal to be disconnected from the first control terminal, and the reset terminal to be disconnected from the second control terminal, so that the first control terminal and the second control terminal are in a floating state.

13. A gate driving circuit, comprising a plurality of stages of shift register units according to claim 1.

14. The gate driving circuit according to claim 13, wherein the gate driving circuit further comprises a temperature controller; and
wherein the temperature controller is configured to detect a temperature of the gate driving circuit, is configured to control the switch control signal, when the temperature is less than a predetermined temperature, so as to control a connection between the input terminal and the first control terminal to be turned on and control a connection between the reset terminal and the second control terminal to be turned on, and is configured to control the switch control signal, when the temperature is greater than or equal to the predetermined temperature, so as to control the first control terminal and the second control the terminal to be in a floating state.

15. A display device, comprising the gate driving circuit according to claim 13.

* * * * *